(12) United States Patent
Yoneyama

(10) Patent No.: US 10,600,831 B2
(45) Date of Patent: Mar. 24, 2020

(54) IMAGE PICKUP APPARATUS, ENDOSCOPE AND IMAGE PICKUP APPARATUS MANUFACTURING METHOD

(71) Applicant: OLYMPUS CORPORATION, Tokyo (JP)

(72) Inventor: Jumpei Yoneyama, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 28 days.

(21) Appl. No.: 16/122,974

(22) Filed: Sep. 6, 2018

(65) Prior Publication Data

US 2019/0006405 A1 Jan. 3, 2019

Related U.S. Application Data

(63) Continuation of application No. PCT/JP2016/059195, filed on Mar. 23, 2016.

(51) Int. Cl.
*H01L 27/146* (2006.01)
*H04N 5/369* (2011.01)

(52) U.S. Cl.
CPC .. *H01L 27/14618* (2013.01); *H01L 27/14636* (2013.01); *H01L 27/14687* (2013.01); *H01L 27/14698* (2013.01); *H04N 5/369* (2013.01)

(58) Field of Classification Search
CPC ......... H01L 27/14618; H01L 27/14636; H01L 27/14687; H01L 27/14698
See application file for complete search history.

(56) References Cited

U.S. PATENT DOCUMENTS

2012/0146116 A1 6/2012 Sato

FOREIGN PATENT DOCUMENTS

| EP | 2858106 A1 | 4/2015 |
|---|---|---|
| JP | 2002-025888 A | 1/2002 |
| JP | 2008-118568 A | 5/2008 |
| JP | 2012-124299 A | 6/2012 |
| JP | 2013-089881 A | 5/2013 |
| JP | 2014-179446 A | 9/2014 |
| WO | WO 2013/179767 A1 | 12/2013 |

OTHER PUBLICATIONS

International Search Report dated May 17, 2016 issued in PCT/JP2016/059195.

*Primary Examiner* — Andrew Q Tran

(74) *Attorney, Agent, or Firm* — Scully, Scott, Murphy & Presser, P.C.

(57) ABSTRACT

An image pickup apparatus includes: an image pickup device with a light receiving portion being formed on a light receiving face; cover glass bonded to the light receiving face; and a wiring board bonded to a back face of the image pickup device; wherein an alignment mark is present on each of two orthogonal side faces, the alignment mark being at a predetermined relative position relative to the light receiving portion.

10 Claims, 10 Drawing Sheets

IMAGE PICKUP APPARATUS, ENDOSCOPE AND IMAGE PICKUP APPARATUS MANUFACTURING METHOD

CROSS REFERENCE TO RELATED APPLICATION

This application is a continuation application of PCT/JP2016/059195 filed on Mar. 23, 2016, the entire contents of which are incorporated herein by this reference.

BACKGROUND OF THE INVENTION

Field of the Invention

The present invention relates to an image pickup apparatus provided with an image pickup device to which an optical member and a wiring board are bonded, an endoscope including the image pickup apparatus, and a method for manufacturing the image pickup apparatus.

Description of the Related Art

An image pickup apparatus provided with an image pickup device is arranged, for example, in a distal-end rigid portion of an electronic endoscope to be used. To reduce a diameter of an endoscope is an important issue, and downsizing of an image pickup apparatus is required.

First, a wafer level package (WLP) type image pickup apparatus will be simply described. The WLP type image pickup apparatus is fabricated by cutting and singulating a bonded wafer configured with an image pickup wafer including a plurality of image pickup devices and a glass wafer bonded to each other. Therefore, the whole light receiving face of an image pickup device where a light receiving portion is formed is covered with cover glass. A first electrode for transmitting and receiving signals with the light receiving portion is connected to a second electrode on a back face via through wiring. The second electrode is bonded to an electrode of the wiring board to which a signal cable is bonded.

On the other hand, in Japanese Patent Application Laid-Open Publication No. 2008-118568, an image pickup apparatus in which the first electrode on the light receiving face is not covered with cover glass is disclosed. The image pickup apparatus is easy to produce because it is not necessary to form through wiring unlike the WLP type image pickup apparatus.

SUMMARY OF THE INVENTION

An image pickup apparatus according to an embodiment of the present invention is provided with: an image pickup device that is a rectangular parallelepiped semiconductor including a light receiving face, a back face opposite to the light receiving face and four side faces, a light receiving portion being formed on the light receiving face; an optical member bonded to the light receiving face; and a wiring board bonded to the back face; wherein an alignment mark is present on each of two orthogonal side faces among the side faces of the image pickup device, the alignment mark being at a predetermined relative position relative to the light receiving portion.

An endoscope according to another embodiment is provided with an image pickup apparatus on a distal-end rigid portion of an insertion portion, the image pickup apparatus being provided with: an image pickup device that is a rectangular parallelepiped semiconductor including a light receiving face, a back face opposite to the light receiving face and four side faces, a light receiving portion being formed on the light receiving face; an optical member bonded to the light receiving face; and a wiring board bonded to the back face; wherein an alignment mark is present on each of two orthogonal side faces among the side faces of the image pickup device, the alignment mark being at a predetermined relative position relative to the light receiving portion.

An image pickup apparatus manufacturing method according to another embodiment is an image pickup apparatus manufacturing method including: an image pickup wafer fabrication process of arranging a plurality of light receiving portions and electrodes connected to the plurality of light receiving portions, respectively, on a semiconductor wafer including a light receiving face and a back face opposite to the light receiving face; a cutting process of cutting the semiconductor wafer along scribe lines to divide the semiconductor wafer into a plurality of image pickup devices including the light receiving portions and the electrodes, respectively; a positioning process of positioning another member at least either on the light receiving face or the back face of each of the image pickup devices; and a bonding process of bonding the image pickup device and the other member that are positioned; wherein in the image pickup wafer fabrication process, alignment portions at predetermined relative positions relative to the light receiving portions are formed in a manner of being across the scribe lines; in the cutting process, cross sections of the alignment portions are exposed on each of two orthogonal side faces of the image pickup devices; and in the positioning process, positioning of the image pickup device and the other member is performed, with the alignment portions exposed on the two side faces of the image pickup device as alignment marks.

DETAILED DESCRIPTION OF THE PREFERRED EMBODIMENTS

First Embodiment

<Structure of Image Pickup Apparatus>

Figure 1:
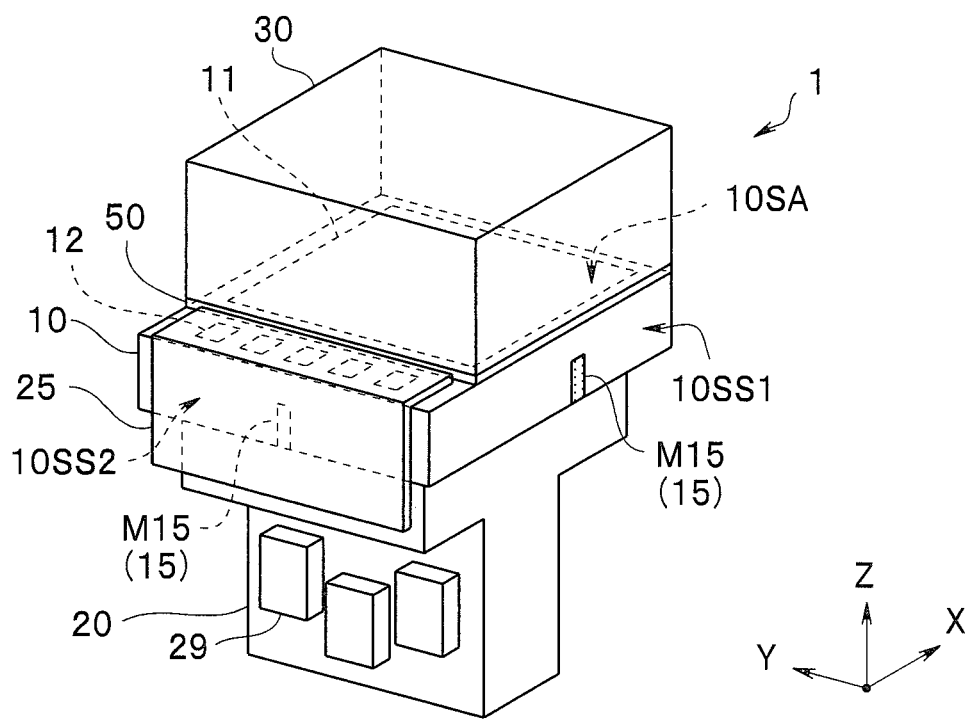
FIG. 1 is a perspective view of an image pickup apparatus according to a first embodiment.
Figure 2:
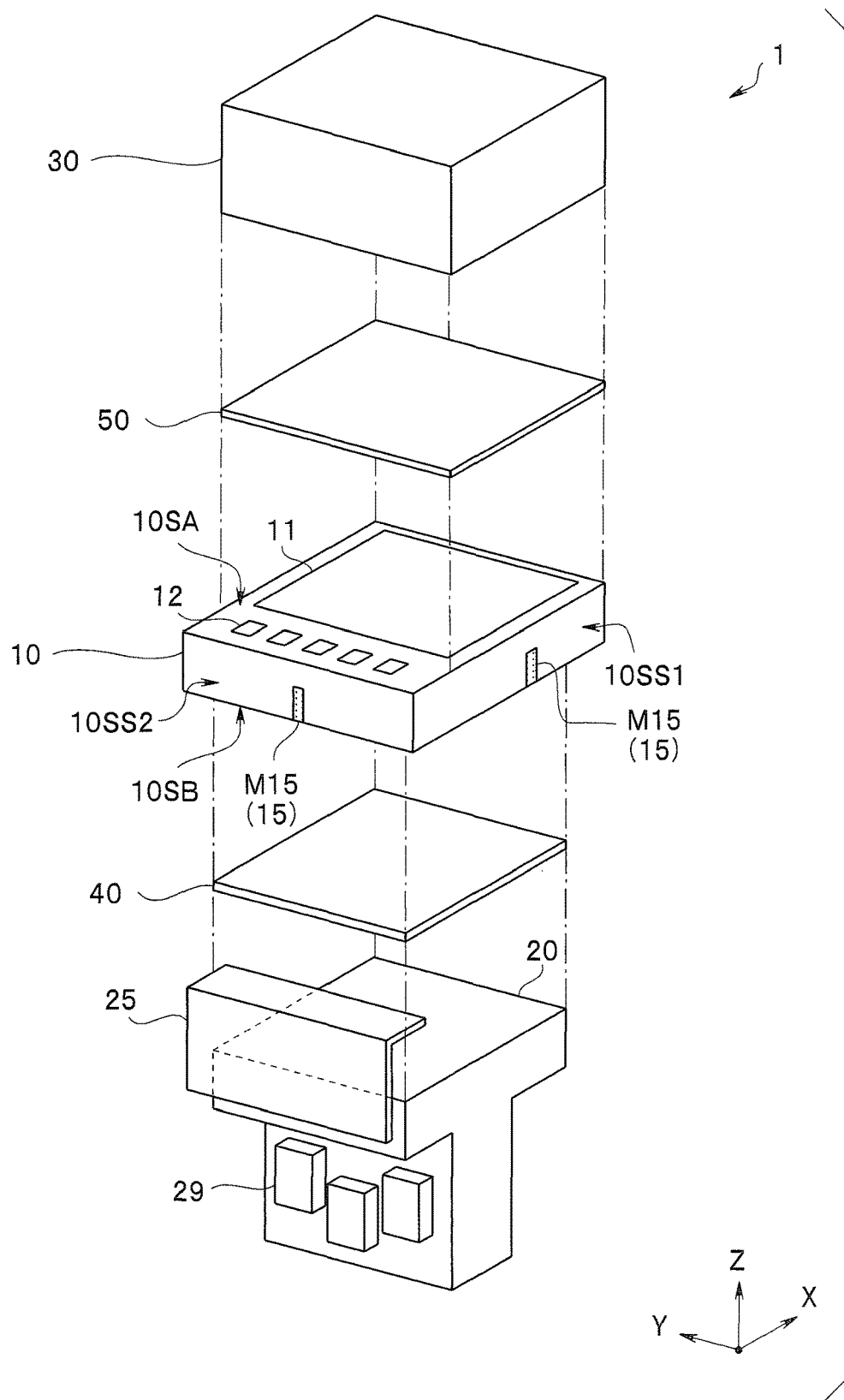
FIG. 2 is an exploded view of the image pickup apparatus according to the first embodiment.

As shown in FIGS. 1 and 2, an image pickup apparatus 1 according to the present embodiment is provided with an image pickup device 10, cover glass 30 which is an optical member, a wiring board 20 and a wiring board 25. A signal cable (not shown) for transmitting and receiving signals is bonded to the wiring board 20, for example, via solder.

In the following description, please keep in mind that the drawings based on each embodiment are schematic, and a relationship between thickness and width of each portion, a thickness ratio among respective portions and the like are different from actual ones; and, among the drawings, portions having a different mutual dimensional relationship or ratio may be included. Further, some components may be neither shown nor given reference numerals.

The image pickup device 10 is a rectangular parallelepiped semiconductor including a light receiving face 10SA configured to receive incident light, a back face 10SB opposite to the light receiving face 10SA and four side faces 10SS. As described later, the image pickup device 10 is fabricated by cutting a semiconductor wafer including a plurality of image pickup devices along scribe lines SL.

A light receiving portion 11 including a CMOS image sensor or the like is formed on the light receiving face 10SA of the image pickup device 10, and a plurality of electrodes 12 connected to the light receiving portion 11 are arranged in line around the light receiving portion 11.

The cover glass 30 which is an optical member is bonded to the light receiving face 10SA of the image pickup device 10 via a bonding layer 50 made of transparent resin. The cover glass 30 configured to protect the light receiving portion 11 completely covers the light receiving portion 11 but does not cover the electrodes 12, and is accurately positioned and bonded so as not to protrude outside of an outer circumferential portion of the image pickup device 10. Note that the optical member may be a lens or the like.

On the other hand, the wiring board 20 is also bonded to the back face 10SB of the image pickup device 10 via a bonding layer 40. The flexible wiring board 25 includes wiring (not shown) connecting the electrodes 12 of the image pickup device 10 and electrodes (not shown) of the wiring board 20.

In the image pickup apparatus 1, alignment marks M15 are present where alignment portions 15 being at predetermined relative positions relative to the light receiving portion 11 are exposed, on two orthogonal side faces 10SS1 and 10SS2, respectively.

In the image pickup apparatus 1, positioning in an in-plane direction (an XY direction) of the image pickup device 10 and the cover glass 30 is performed based on the alignment marks M15 on the side faces of the image pickup device 10. Therefore, the image pickup apparatus 1 is easy to manufacture.

<Method for Manufacturing Image Pickup Apparatus>

Figure 3:
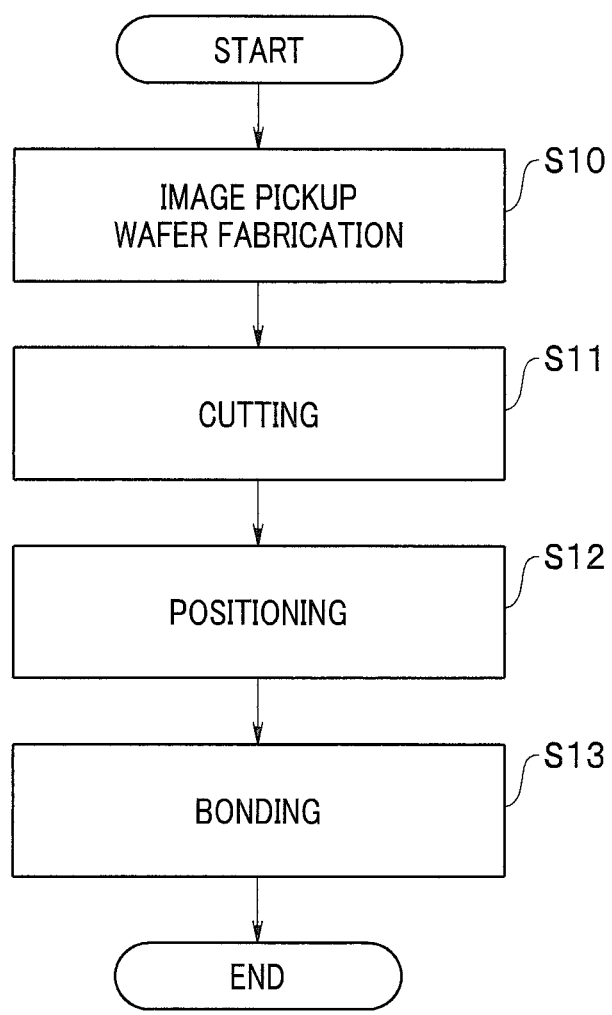
FIG. 3 is a flowchart for illustrating a method for manufacturing the image pickup apparatus according to the first embodiment.

Next, a method for manufacturing the image pickup apparatus 1 will be described along a flowchart in FIG. 3.

<Step S10> Image Pickup Wafer Fabrication Process

Figure 4:
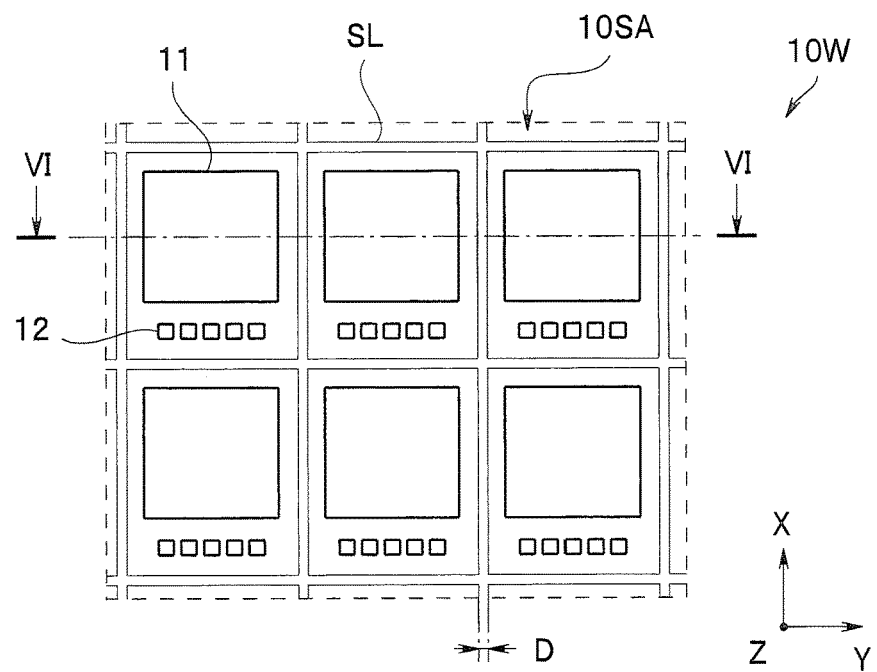
FIG. 4 is a top view of a wafer that includes image pickup devices for the image pickup apparatus according to the first embodiment.

As shown in FIG. 4, an image pickup wafer 10W made of a semiconductor such as silicon, and including a plurality of image pickup devices 10 on the light receiving face 10SA is formed using a known semiconductor manufacturing technique. Each image pickup device 10 includes the light receiving portion 11 including a CMOS (complementary metal oxide semiconductor) image sensor or a CCD (charge coupled device), and the plurality of electrodes 12 connected to the light receiving portion 11. The image pickup device 10 is extremely small-sized, for example, with plan view dimensions of 5 mm×5 mm.

Note that in FIG. 4 and others, scribe lines SL with a predetermined width which are secured as "cutting margins" in a cutting process are shown. That is, the scribe lines SL show areas assumed to be lost by cutting. The scribe lines SL may be indicated, for example, by a conductive pattern or the like or may be indicated as recess portions or the like. Further, the scribe lines SL may be shown only on an outer circumferential portion of the image pickup wafer 10W as positioning marks at the time of cutting.

Figure 5:
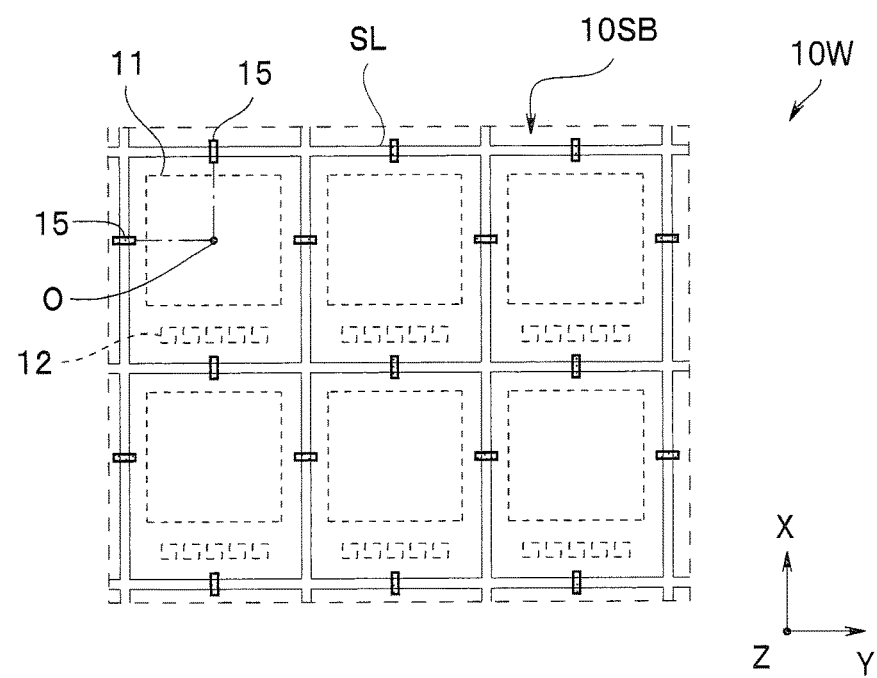
FIG. 5 is a bottom view of the wafer that includes the image pickup devices for the image pickup apparatus according to the first embodiment.
Figure 6:
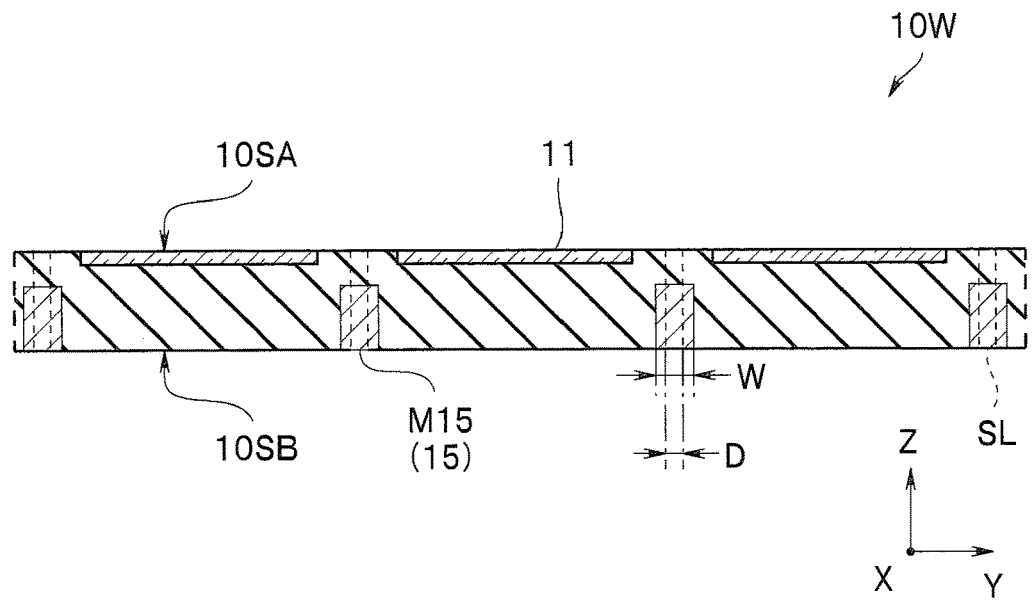
FIG. 6 is a cross-sectional view of the wafer that includes the image pickup devices for the image pickup apparatus according to the first embodiment taken along a line IV-IV of FIG. 4.

On the other hand, as shown in FIGS. 5 and 6, the alignment portions 15 are embedded at predetermined positions on the back face 10SB of the wafer 10W. The alignment portions 15 are arranged by forming recess portions by etching after forming a mask pattern by photolithography on the back face 10SB, and filling metal or the like inside the recess portions.

For the etching, a wet etching method or a dry etching method such as reactive ion etching (RIE) is used. As a method for filling metal inside the recess portions, for example, a via-fill plating method is used after forming insulating layers and underlying conductive films on wall surfaces of the recess portions by a CVD method.

Two alignment portions 15, that is, two recess portions, are arranged so as to indicate a center O of a rectangular light receiving portion 11 on the light receiving face 10SA. For example, a mask pattern is formed while positions of light receiving portions 11 on the light receiving face 10SA are being confirmed, using a double-sided mask alignment apparatus, and recess portions are formed on the back face 10SB by etching.

Each alignment portion 15 (the recess portions) is formed in a manner of being across a scribe line SL. That is, a width W of the alignment portion 15 is wider than a width D of the scribe line SL.

<Step S11> Cutting Process

The semiconductor wafer 10W is cut along the scribe lines SL and divided into a plurality of image pickup devices 10 each of which includes the light receiving portion 11 and the electrodes 12.

As shown in FIG. 6, when the wafer 10W is cut along the scribe lines SL by dicing, a "cutting margin" with the width (D) corresponding to a thickness of a dicing blade occurs. The width (W) of the alignment portions 15 is set to be wider than the width D of the scribe lines SL corresponding to the "cutting margin", and set in consideration of a deviation (an error) of a cutting position. For example, if the width D of the scribe lines SL is 5 µm, and the cutting error is 2 µm, the width W of the alignment portions 15 is set to about 10 µm. Then, cutting planes of the alignment portions 15 are exposed on side faces as alignment marks M15.

<Step S12> Positioning Process

Positioning is performed to bond the cover glass 30 to the light receiving face 10SA of each image pickup device 10. Dimensions of the cover glass 30 are set to be slightly larger than the dimensions of the light receiving portion 11.

Since the image pickup device 10 is extremely small-sized with a side of 5 mm as already described, it is not easy to accurately position the cover glass 30 in a manner of covering the light receiving portion 11 and not covering the electrodes 12.

Figure 7:
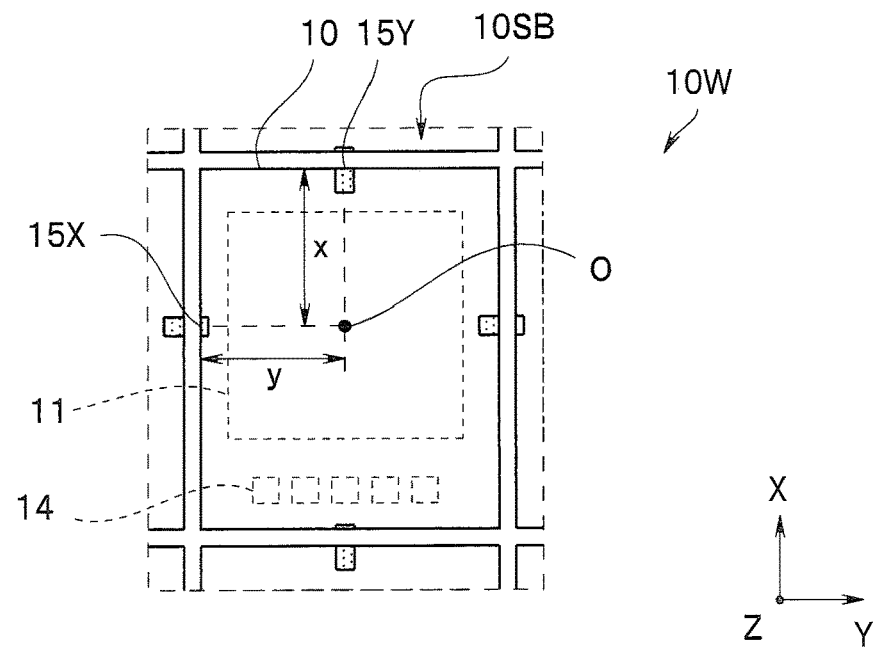
FIG. 7 is a top view of the wafer that includes the image pickup devices for the image pickup apparatus according to the first embodiment.

If an outer circumferential face or the like of the image pickup device 10 is used as a reference, it is not possible to accurately perform positioning due to a cutting error. For example, in the image pickup device 10 shown in FIG. 7, lines actually cut in an up-down direction (an X direction) are deviated slightly upward in scribe lines SL, and lines cut in a left-right direction (a Y direction) are deviated slightly to the right in scribe lines SL due to cutting errors. That is, distances (x, y) from the outer circumferential surface to the center O of the light receiving portion 11 change due to cutting errors.

In the image pickup device 10, however, the cutting planes of the alignment portions 15 are exposed on the side faces 10SS1 and 10SS2 as the alignment marks M15. Because fabrication is performed by a photolithography method, relative positions of the alignment marks M15 to the center O of the light receiving portion 11 are extremely accurate, and do not change due to cutting errors. The alignment marks M15 can be confirmed from the side faces 10SS1 and 10SS2. Therefore, it is possible to easily and accurately position the cover glass 30.

<Step S13> Bonding Process

The cover glass 30 positioned on the light receiving face 10SA of the image pickup device 10 is bonded via the bonding layer 50. For the bonding layer 50, for example, epoxy, acrylic or silicone-based UV curable resin or thermosetting curable resin can be used. Further, a state before hardening may be either a liquid state or a film state. If the bonding layer 50 is transparent, the resin may be, for example, dropped onto the light receiving portion 11 before the positioning process or may be injected after positioning.

If the bonding layer 50 is UV curable type resin, the resin hardens by radiating ultraviolet rays.

Furthermore, electrodes of the wiring board 25 are, for example, ultrasound-bonded to the electrodes 12 on the light receiving face 10SA. The wiring board 25 may be bonded to the wiring board 20 in advance. The wiring board 20 is bonded to the back face 10SB of the image pickup device 10, and a signal cable (not shown) is solder-bonded to the wiring board 20.

Since the cover glass 30 can be positioned, with the faces of the alignment portions 15 exposed on the side faces of the image pickup device 10 as the alignment marks M15, the image pickup apparatus 1 is easy to manufacture.

Note that in the image pickup apparatus 1, the cross sections of the alignment portions 15 are exposed on the four side faces of the image pickup device 10 as shown in FIG. 5. However, it goes without saying that, if alignment marks M15 exist at least on the two orthogonal side faces 10SS1 and 10SS2, alignment of the cover glass 30 in the in-plane direction (the XY direction) is easy.

Figure 8:
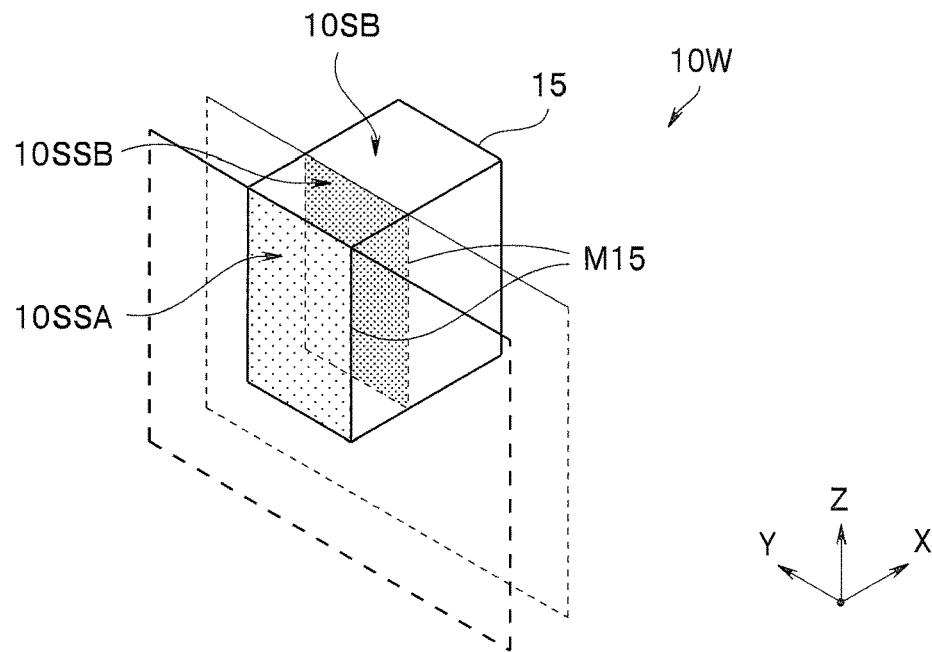
FIG. 8 is a perspective view of an alignment portion of the image pickup devices for the image pickup apparatus according to the first embodiment.

Note that as shown in FIG. 8, since each alignment portion 15 is a rectangular parallelepiped, a shape of an alignment mark M15 exposed on a side face is a rectangle that is a same shape as a cross-sectional shape of the alignment portion 15 embedded inside under an exposed face. Therefore, whether the cutting plane is a side face 10SSA or a side face 10SSB due to a cutting error, the shape and size of the alignment marks M15 are the same.

Figure 9:
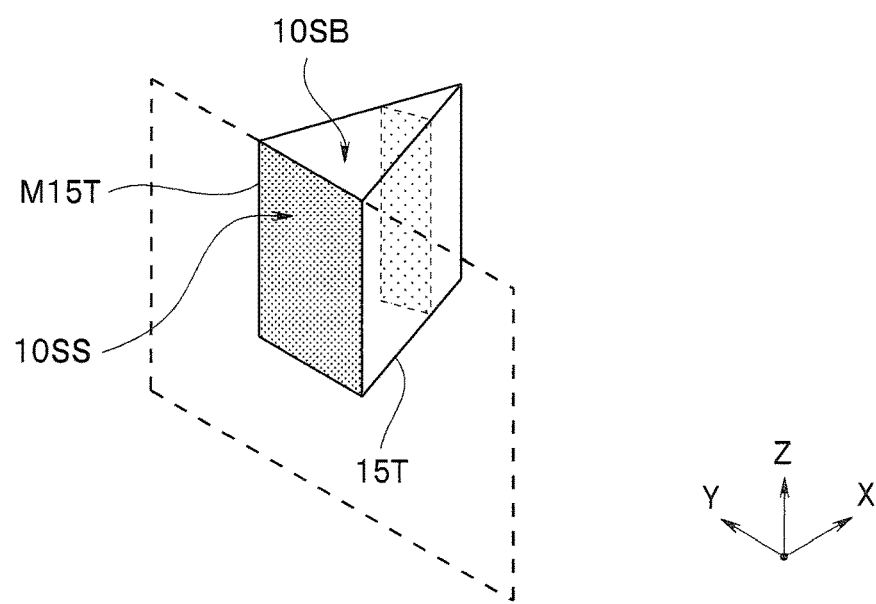
FIG. 9 is a perspective view of another alignment portion of the image pickup devices for the image pickup apparatus according to the first embodiment.

The alignment portion 15 is not limited to a rectangular parallelepiped. For example, in the case of an alignment portion 15T shown in FIG. 9, a cross-section in a direction orthogonal to a cutting plane is triangular. Therefore, when the cutting plane is different, an alignment mark M15 exposed on a side face is in a same rectangular shape but is different in size (width). In other words, the size of the alignment mark M15 is different from the size of the cross section of the alignment portion 15 embedded inside under the exposed face.

In the case of an image pickup device including the alignment portions 15T, it is possible to estimate a cutting error from the size of the alignment mark M15. Therefore, it is possible to, at the time of cutting a next wafer, adjust a cutting position or adjust a size of the cover glass 30 to be bonded.

Second Embodiment

Next, an image pickup apparatus 1A according to a second embodiment and a method for manufacturing the image pickup apparatus 1A will be described. The image pickup apparatus 1A and the like are similar to the image pickup apparatus 1 and have same effects. Therefore, same components will be given same reference numerals, and description of the components will be omitted.

Figure 10:
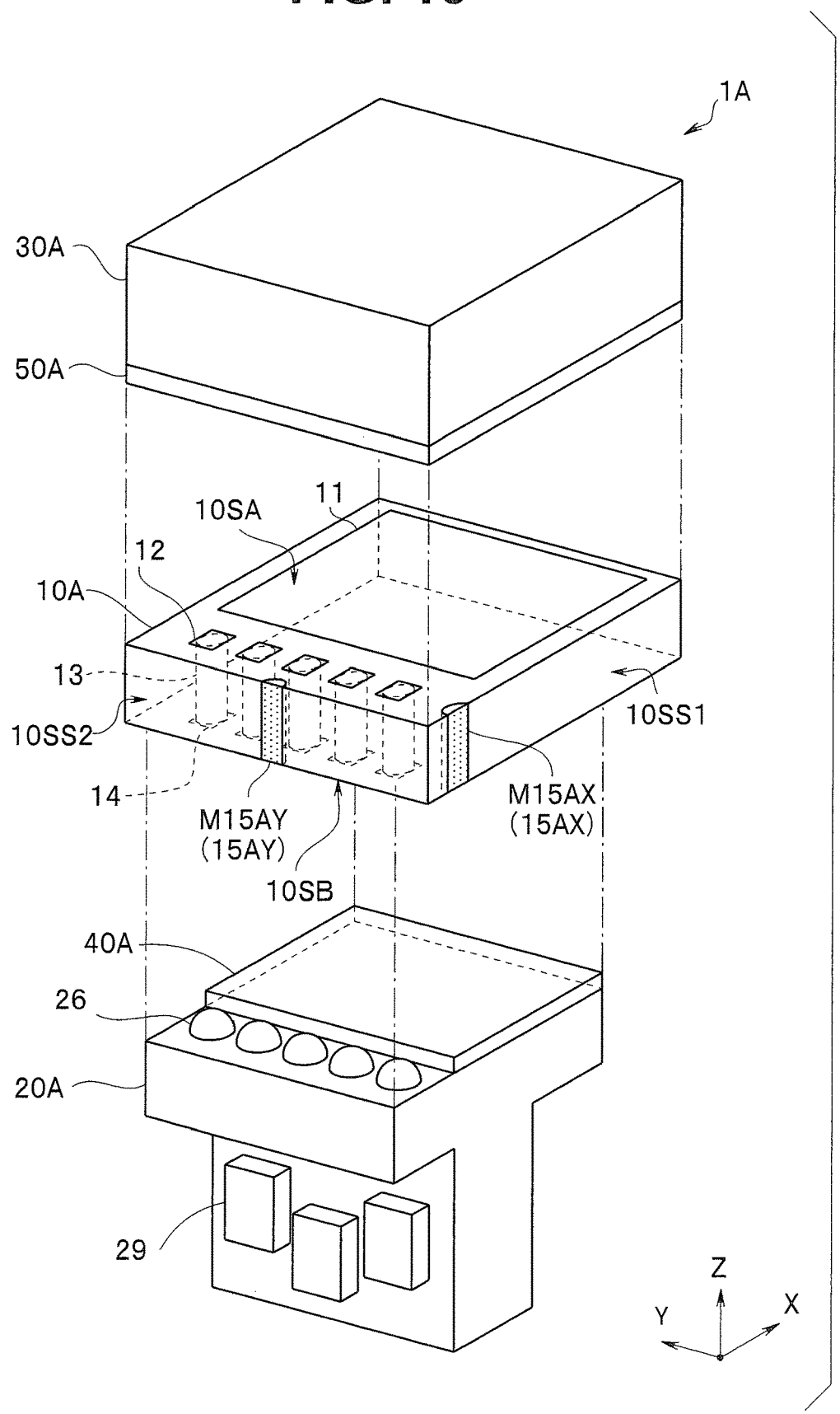
FIG. 10 is an exploded view of an image pickup device for an image pickup apparatus according to a second embodiment.

As shown in FIG. 10, the image pickup device 10A of the image pickup apparatus 1A is of a WLP type in which not only the light receiving portion 11 but also the electrodes 12 on the light receiving face 10SA are covered with the cover glass 30. The electrodes 12 are electrically connected to electrodes 14 on the back face 10SB via through wiring 13. The image pickup device 10A is fabricated by a glass wafer and a semiconductor wafer being bonded and then cut.

The electrodes 14 on the back face 10SB of the image pickup device 10A are accurately positioned relative to electrodes 26 of a wiring board 20A based on alignment marks M15A (M15AX and M15AY) and bonded. Note that though the bonding layer 40A is not arranged for a bonding portion between the electrodes 14 and the electrodes 26, in FIG. 10, the bonding layer 40A may also serve as sealing resin of the bonding portion.

The alignment portions 15A of the image pickup device 10A have a same configuration as the through wiring 13 and arranged according to arrangement of the electrodes 14. That is, the X-direction alignment portion 15AX is arranged on an extension line in a direction of the plurality of electrodes 14 being arranged in line, and the Y-direction alignment portion 15AY shows a position of a central electrode.

In the small size image pickup device 10A, the electrodes 14 and the electrodes 26 are small, and arrangement intervals of the electrodes 14 and the electrodes 26 are short. Therefore, it is not easy to accurately position the electrodes 14 and the electrodes 26 of the wiring board 20A. However, since the alignment marks M15A (M15AX and M15AY) of the alignment portions 15A (15AX and 15AY) exposed on the side faces 10SS1 and 10SS2 are used as references, it is possible to easily perform alignment.

Furthermore, in the image pickup device 10A, the alignment portions 15A have the same configuration as the through wiring 13 and are simultaneously embedded in a semiconductor wafer when the through wiring 13 is arranged on the semiconductor wafer in a same process.

The image pickup device 10A which includes the through wiring 13 penetrating through the light receiving face 10SA and the back face 10SB and in which the alignment portions 15A have the same configuration as the through wiring 13 is easier to manufacture than the image pickup device 10.

Though the alignment portions 15A are at predetermined relative positions relative to the electrodes 14, the electrodes 14 are at predetermined relative positions relative to the light receiving portion 11. Therefore, the alignment portions 15A can be regarded as also being at predetermined relative positions relative to the light receiving portion 11.

The electrodes 14 and the electrodes 26 of the wiring board 20A may be positioned based on alignment marks at predetermined relative positions relative to the light receiving portion 11.

Third Embodiment

Next, an image pickup apparatus 1B according to a third embodiment and a method for manufacturing the image pickup apparatus 1B will be described. The image pickup apparatus 1B and the like are similar to the image pickup apparatus 1 and have the same effects. Therefore, same components will be given same reference numerals, and description of the components will be omitted.

Figure 11:
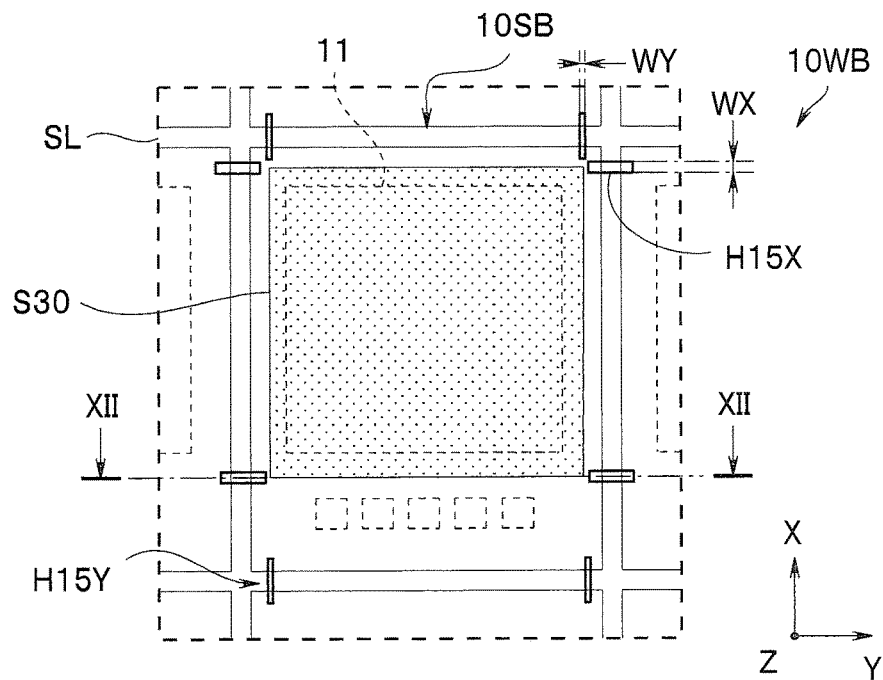
FIG. 11 is a bottom view of a wafer that includes image pickup devices for an image pickup apparatus according to a third embodiment.
Figure 12:
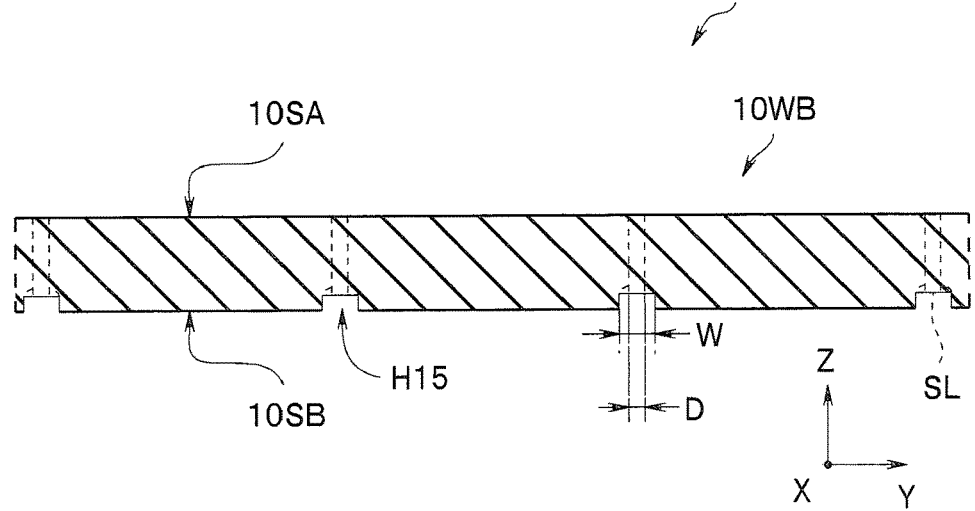
FIG. 12 is a cross-sectional view of the wafer that includes the image pickup devices for the image pickup apparatus according to the third embodiment taken along a line XI-XI of FIG. 11.

As shown in FIGS. 11 and 12, the image pickup device 10B of the image pickup apparatus 1B is fabricated by cutting a wafer 10WB along scribe lines SL.

Figure 13:
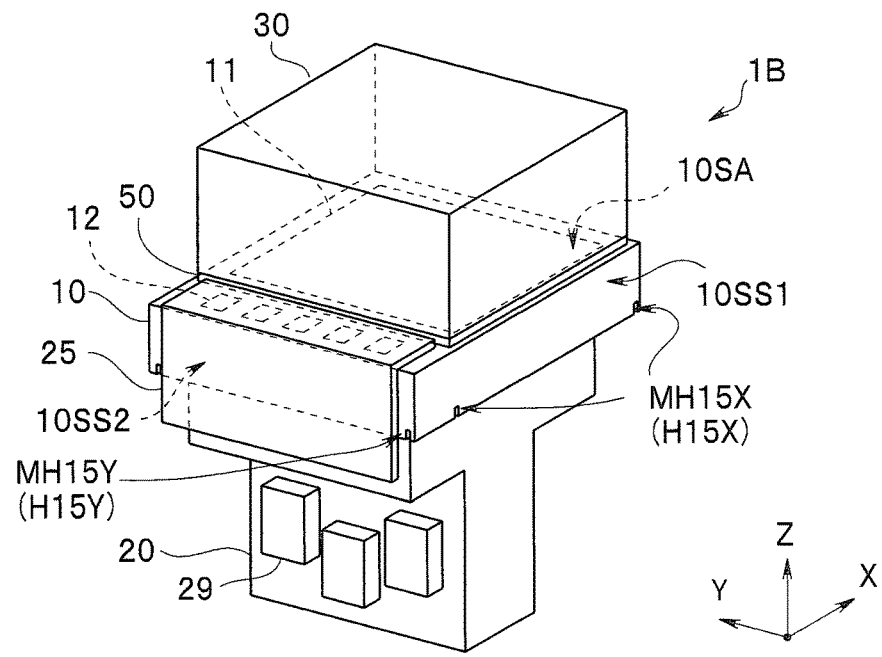
FIG. 13 is a perspective view of the image pickup devices for the image pickup apparatus according to the third embodiment.

In the image pickup apparatus 1B, recess portions formed on the back face 10SB of the wafer 10WB are positioning portions H15 (H15X and H15Y). As shown in FIG. 13, cross sections of the positioning portions H15 that appear on the side faces 10SS1 and 10SS2 of the image pickup device 10B by cutting become alignment marks MH15 (MH15X and MH15Y).

Since it is not necessary to fill the recess portions H15 with metal or the like, the image pickup apparatus 1B is easier to manufacture than the image pickup apparatus 1 and the like.

Furthermore, the X-direction positioning portion H15X and the Y-direction positioning portion H15Y are different in cross-sectional shapes (widths). That is, the width of the positioning portion H15X is WX, and the width of the positioning portion H15Y is WY. Therefore, in the image pickup apparatus 1B, it is possible to easily recognize a turning direction of the cover glass 30 by a difference between the widths of the positioning marks MH15.

Furthermore, the positioning marks MH15X and MH15Y are arranged at two positions in each side face according to positions of the side faces, that is, widths of the cover glass 30 to be bonded. Therefore, in the image pickup apparatus 1B, positioning of the cover glass 30 is easier.

Note that even if alignment portions are for alignment between an image pickup device and a wiring board as in the image pickup apparatus 1A, same effects as the image pickup apparatus 1B and the like are obtained if there are two alignment marks according to a width of the wiring board. Further, it goes without saying that, if alignment marks on two orthogonal sides are different from each other or if there are two alignment marks according to a width of an optical member or a wiring board on each of two orthogonal side faces, the same effects as the image pickup apparatus 1B and the like are obtained.

Modification of Third Embodiment

Figure 14:
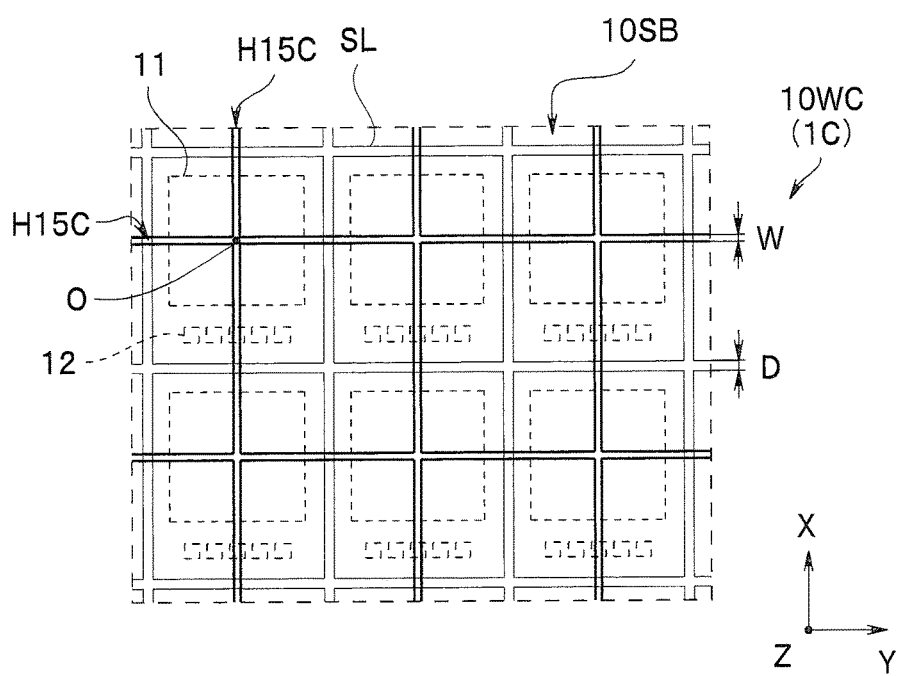
FIG. 14 is a bottom view of a wafer that includes image pickup devices for an image pickup apparatus according to a modification of the third embodiment.

In image pickup devices 10C according to a modification of the third embodiment shown in FIG. 14, alignment portions H15C formed on the back face 10SB of a wafer 10WC are elongated grooves.

It is desirable that a width W of the alignment portions H15C is about the width WX of the positioning portions H15X or the width WY of the positioning portions H15Y in FIG. 11. Note that the elongated grooves of the alignment portions H15C can be also formed using a dicing saw used at the time of dicing, by adjusting a depth to be cut. At this time, the width W of the alignment portions H15C is set to be narrower than the width D of scribe lines SL. When such a wafer 10WC is cut along the scribe lines SL, cutting planes of the alignment portions H15C are exposed on side faces of the image pickup devices 10C. In the image pickup devices 10C, the cutting planes of the alignment portions H15C are necessarily exposed on the side faces even if a cutting error is larger than expected.

That is, positioning portions are not necessarily required to be isolated recess portions but may be a continuous groove. Further, insides of the groove may be filled with metal or the like.

Fourth Embodiment

Next, an endoscope 9 according to a fourth embodiment will be described. Since image pickup apparatuses 1, and 1A to 1C for the endoscope 9 are the same as the image pickup apparatus 1 and the like of the first embodiment, description will be omitted. Description will be made below with the endoscope 9 including the image pickup apparatus 1 as an example.

Figure 15:
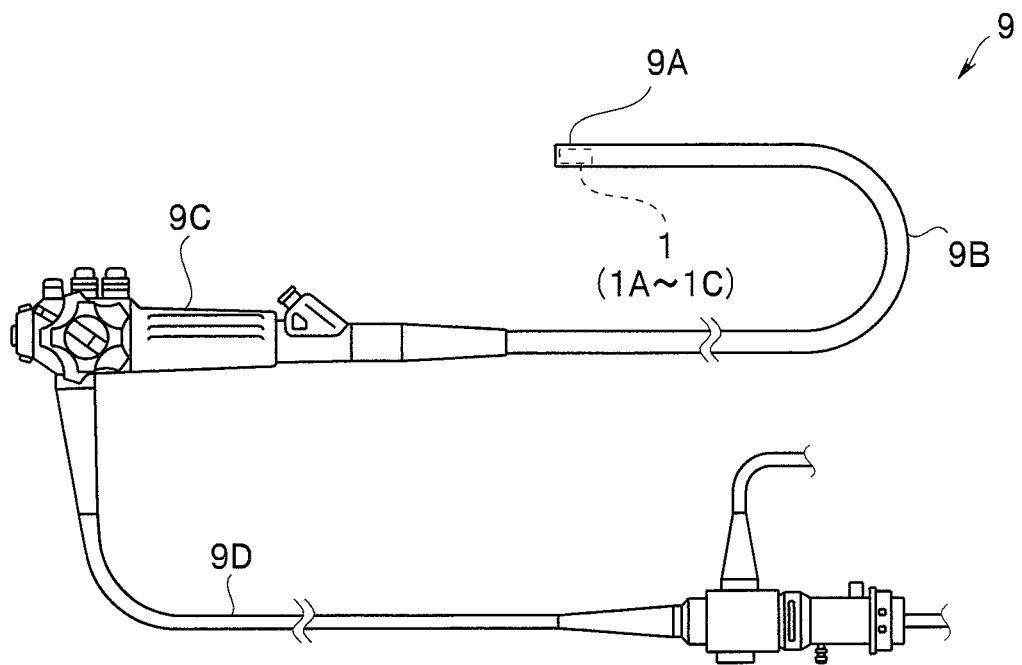
FIG. 15 is a perspective view of an endoscope according to a fourth embodiment.

As shown in FIG. 15, the endoscope 9 is provided with an insertion portion 9B with the image pickup apparatus 1, which is easy to manufacture, arranged on a distal-end rigid portion 9A, an operation portion 9C arranged on a proximal end side of the insertion portion 9B, and a universal cord 9D extending from the operation portion 9C.

Since the endoscope 9 includes the image pickup apparatus 1 on the distal-end rigid portion 9A of the insertion portion 9B, the endoscope 9 is easy to manufacture.

The present invention is not limited to the embodiments and modification described above, but various changes, alterations and the like can be made within a range not changing the spirit of the present invention.

What is claimed is:

1. An image pickup apparatus comprising:
    an image pickup device that is a rectangular parallelepiped semiconductor including a light receiving face configured to receive incident light, a back face opposite to the light receiving face and four side faces, a light receiving portion being formed on the light receiving face;
    an optical member bonded to the light receiving face; and
    a wiring board bonded to the back face; wherein
    an alignment mark is present on each of two orthogonal side faces among the side faces of the image pickup device, the alignment mark being at a predetermined relative position relative to the light receiving portion.
2. The image pickup apparatus according to claim 1, wherein the alignment mark is an exposed face of an alignment portion embedded in the image pickup device, the exposed face being exposed on the side face.

3. The image pickup apparatus according to claim 2, wherein a shape of the alignment mark is a same shape as a shape of a cross section of the alignment portion embedded inside under the side face.

4. The image pickup apparatus according to claim 3, wherein a size of the alignment mark is different from a size of the cross section of the alignment portion embedded inside under the side face.

5. The image pickup apparatus according to claim 2, wherein
the image pickup device includes through wiring penetrating through the light receiving face and the back face; and
the alignment portion has a same configuration as the through wiring.

6. The image pickup apparatus according to claim 1, wherein the alignment mark is a recess portion on the side face of the image pickup device.

7. The image pickup apparatus according to claim 1, wherein the alignment marks of the two orthogonal side faces of the image pickup device are different.

8. The image pickup apparatus according to claim 1, wherein there are two of the alignment marks, each of the alignment marks corresponding to a width of the optical member or the wiring board, on each of the two orthogonal side faces of the image pickup device.

9. An endoscope comprising the image pickup apparatus according to claim 1.

10. An image pickup apparatus manufacturing method comprising:

an image pickup wafer fabrication process of arranging a plurality of light receiving portions and electrodes connected to the plurality of light receiving portions, respectively, on a semiconductor wafer including a light receiving face configured to receive incident light and a back face opposite to the light receiving face;

a cutting process of cutting the semiconductor wafer along scribe lines to divide the semiconductor wafer into a plurality of image pickup devices including the light receiving portions and the electrodes, respectively;

a positioning process of positioning an optical member or a wiring board at least either on the light receiving face or the back face of each of the image pickup devices; and a bonding process of bonding the image pickup device, and the optical member or the wiring board that are positioned; wherein in the image pickup wafer fabrication process, alignment portions at predetermined relative positions relative to the light receiving portions are formed in a manner of being across the scribe lines;

in the cutting process, cross sections of the alignment portions are exposed on each of two orthogonal side faces of the image pickup devices; and in the positioning process, positioning of the image pickup device, and the optical member or the wiring board is performed, with the alignment portions exposed on the two side faces of the image pickup device as alignment marks.

* * * * *